(12) United States Patent
Sohn et al.

(10) Patent No.: US 11,532,687 B2
(45) Date of Patent: Dec. 20, 2022

(54) THIN FILM TRANSISTOR, DISPLAY PANEL HAVING THE SAME, AND METHOD OF MANUFACTURING THE DISPLAY PANEL

(71) Applicant: Samsung Display Co., Ltd., Yongin-si (KR)

(72) Inventors: Sangwoo Sohn, Yongin-si (KR); Myounghwa Kim, Seoul (KR); TaeSang Kim, Seoul (KR); Hyungjun Kim, Seoul (KR); Yeon Keon Moon, Hwaseong-si (KR); Joon Seok Park, Yongin-si (KR); Sangwon Shin, Yongin-si (KR); Jun Hyung Lim, Seoul (KR); Hyelim Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/880,792

(22) Filed: May 21, 2020

(65) Prior Publication Data

US 2021/0036086 A1 Feb. 4, 2021

(30) Foreign Application Priority Data

Jul. 30, 2019 (KR) .................. 10-2019-0092417

(51) Int. Cl.
*H01L 27/32* (2006.01)
*H01L 51/56* (2006.01)
(Continued)

(52) U.S. Cl.
CPC ...... *H01L 27/3276* (2013.01); *H01L 27/3246* (2013.01); *H01L 27/3262* (2013.01);
(Continued)

(58) Field of Classification Search
CPC ............. H01L 27/3276; H01L 27/3246; H01L 27/3262; H01L 29/7869; H01L 51/5237;
(Continued)

(56) References Cited

U.S. PATENT DOCUMENTS 9,093,541 B2 7/2015 Kitakado et al.
9,773,815 B2 9/2017 Yamazaki et al.
(Continued)

FOREIGN PATENT DOCUMENTS

JP 2018-170324 A 11/2018
JP 2019-24105 A 2/2019
KR 10-2018-0123028 A 11/2018

*Primary Examiner* — Dzung Tran
(74) *Attorney, Agent, or Firm* — Lewis Roca Rothgerber Christie LLP

(57) ABSTRACT

A display panel includes a base layer, a first thin film transistor on the base layer, a second thin film transistor electrically coupled to the first thin film transistor, and a light emitting element electrically coupled to the second thin film transistor. The first thin film transistor includes a first semiconductor pattern on the base layer, a first barrier pattern on the first semiconductor pattern and including a gallium (Ga) oxide and a zinc (Zn) oxide, and a first control electrode on the first barrier pattern and overlapping the first semiconductor pattern. Accordingly, a signal transmission speed of the display panel may be improved, and electrical characteristics and reliability of the thin film transistor included in the display panel may be improved.

11 Claims, 12 Drawing Sheets

(51) Int. Cl.
*H01L 51/52* (2006.01)
*H01L 29/786* (2006.01)

(52) U.S. Cl.
CPC ...... *H01L 29/7869* (2013.01); *H01L 51/5237* (2013.01); *H01L 51/56* (2013.01); *H01L 2227/323* (2013.01); *H01L 2251/303* (2013.01)

(58) Field of Classification Search
CPC .............. H01L 51/56; H01L 2227/323; H01L 2251/303
USPC .......................................................... 257/40
See application file for complete search history.

(56) References Cited

U.S. PATENT DOCUMENTS

| | | |
|---|---|---|
| 9,812,582 B2 | 11/2017 | Yamazaki |
| 10,134,914 B2 | 11/2018 | Yamazaki et al. |
| 10,453,965 B2 | 10/2019 | Yamaguchi et al. |
| 2011/0297944 A1* | 12/2011 | Choi .................. H01L 27/3248 438/34 |
| 2015/0053935 A1* | 2/2015 | Gupta ................ H01L 27/1251 257/40 |
| 2015/0115256 A1* | 4/2015 | You .................... H01L 27/3265 257/40 |
| 2016/0307988 A1* | 10/2016 | Kim .................... H01L 27/1225 |
| 2017/0162606 A1* | 6/2017 | Yan .................... H01L 29/78648 |
| 2017/0236949 A1* | 8/2017 | Yamazaki ............... H01L 29/24 257/43 |
| 2017/0263783 A1* | 9/2017 | Yamazaki ......... H01L 29/78618 |
| 2018/0069190 A1* | 3/2018 | Kim .................... H01L 27/1108 |
| 2018/0182870 A1 | 6/2018 | Hosaka et al. |
| 2018/0350994 A1 | 12/2018 | Hosaka et al. |

\* cited by examiner

THIN FILM TRANSISTOR, DISPLAY PANEL HAVING THE SAME, AND METHOD OF MANUFACTURING THE DISPLAY PANEL

CROSS-REFERENCE TO RELATED APPLICATION

This application claims priority to and the benefit of Korean Patent Application No. 10-2019-0092417, filed on Jul. 30, 2019, the entire content of which is incorporated herein by reference.

BACKGROUND

1. Field

Embodiments of the present disclosure relate to a thin film transistor, a display panel including the same, and a method of manufacturing the display panel. For example, embodiments of the present disclosure relate to a thin film transistor having improved electrical characteristics and reliability, a display panel including the thin film transistor, and a method of manufacturing the display panel.

2. Description of the Related Art

A display device includes signal lines, pixels, and driving circuits, e.g., a gate driving circuit and a data driving circuit, that control the pixels. Each pixel includes a display element and a pixel driving circuit that controls the display element. The pixel driving circuit includes thin film transistors coupled to each other.

SUMMARY

Embodiments of the present disclosure provide a display panel having improved signal transmission speed.

Embodiments of the present disclosure provide a thin film transistor having improved electrical characteristics and reliability.

Embodiments of the present disclosure provide a method of manufacturing a display panel in which occurrences of defects in the process are reduced.

Embodiments of the present disclosure provide a display panel including a base layer, a first thin film transistor on the base layer, a second thin film transistor electrically coupled to the first thin film transistor, and a light emitting element electrically coupled to the second thin film transistor. The first thin film transistor includes a first semiconductor pattern on the base layer, a first barrier pattern on the first semiconductor pattern and including a gallium (Ga) oxide and a zinc (Zn) oxide, and a first control electrode on the first barrier pattern and overlapping the first semiconductor pattern.

The first thin film transistor includes a first input electrode and a first output electrode, which are coupled to the first semiconductor pattern.

The display panel further includes a first insulating layer on the base layer to cover the first semiconductor pattern, and the first insulating layer is between the first semiconductor pattern and the first barrier pattern.

The first insulating layer is in contact with the first semiconductor pattern, the first barrier pattern is in contact with the first insulating layer, and the first control electrode is in contact with the first barrier pattern.

The display panel further includes a second insulating layer on the first insulating layer to cover the first control electrode. The second thin film transistor includes a second semiconductor pattern on the base layer, a second barrier pattern on the second insulating layer and including the gallium (Ga) oxide and the zinc (Zn) oxide, a second control electrode on the second barrier pattern and overlapping the second semiconductor pattern, and a second input electrode and a second output electrode, which are coupled to the second semiconductor pattern.

The display panel further includes a third barrier pattern on the first insulating layer and a gate line on the third barrier pattern and electrically coupled to the first thin film transistor.

The display panel further includes a capacitor electrically coupled to the second thin film transistor. The capacitor includes a fourth barrier pattern on the first insulating layer, a first electrode on the fourth barrier pattern, a fifth barrier pattern on the second insulating layer, and a second electrode on the fifth barrier pattern.

The third barrier pattern, the fourth barrier pattern, and the fifth barrier pattern include a same material as the first barrier pattern.

The first control electrode includes a first layer including titanium (Ti) and a second layer on the first layer and including copper (Cu).

A content of the gallium oxide is from about 4 at % to about 8 at % with respect to a total amount of atoms in the first barrier pattern, and a content of the zinc oxide is from about 92 at % to about 96 at % with respect to the total amount of atoms in the first barrier pattern.

The first semiconductor pattern includes the gallium (Ga) oxide, the zinc (Zn) oxide, and an indium (In) oxide.

The first barrier pattern has a thickness equal to or greater than about 100 angstroms and equal to or smaller than about 200 angstroms.

Embodiments of the present disclosure provide a thin film transistor including a first semiconductor pattern including a channel area and a contact area, a first insulating layer on the first semiconductor pattern, a first barrier pattern on the first insulating layer and including a gallium (Ga) oxide and a zinc (Zn) oxide, a first control electrode on the first barrier pattern and overlapping the channel area of the first semiconductor pattern, a first input electrode coupled to the contact area of the first semiconductor pattern, and a first output electrode coupled to the contact area of the first semiconductor pattern.

The first barrier pattern and the first control electrode overlap the channel area of the first semiconductor pattern.

Embodiments of the present disclosure provide a method of manufacturing a display panel, which includes forming a semiconductor pattern on a base layer, forming a barrier pattern on the semiconductor pattern using a gallium (Ga) oxide and a zinc (Zn) oxide, forming a control electrode on the barrier pattern to overlap the semiconductor pattern, forming an input electrode and an output electrode on the base layer such that the input electrode and the output electrode are coupled to the semiconductor pattern, and forming a light emitting element on the base layer.

The semiconductor pattern is formed using the gallium (Ga) oxide, the zinc (Zn) oxide, and an indium (In) oxide, and the forming of the semiconductor pattern is performed under an oxygen partial pressure equal to or smaller than about 40%.

The method further includes forming an insulating layer to cover the barrier pattern and the control electrode after the forming of the control electrode, and the forming of the insulating layer is performed by a chemical vapor deposition (CVD) method.

The forming of the barrier pattern and the control electrode includes forming a preliminary barrier layer using the gallium (Ga) oxide and the zinc (Zn) oxide, depositing a metal material on the preliminary barrier layer to form a preliminary electrode layer, and etching the preliminary barrier layer and the preliminary electrode layer.

Embodiments of the present disclosure provide a display panel including a base layer, a buffer layer on the base layer, a first thin film transistor on the buffer layer, a second thin film transistor on the buffer layer and electrically coupled to the first thin film transistor, a pixel definition layer on the buffer layer and provided with an opening defined therethrough, a light emitting element in the opening and electrically coupled to the second thin film transistor, and a thin film encapsulation layer on the pixel definition layer and the light emitting element. The first thin film transistor includes a first semiconductor pattern on the base layer, a first barrier pattern on the first semiconductor pattern and including a gallium (Ga) oxide and a zinc (Zn) oxide, and a first control electrode on the first barrier pattern and overlapping the first semiconductor pattern.

According to the above, the barrier pattern is under the control electrode, and the barrier pattern is formed of the metal oxide that does not include indium. Therefore, even though the oxide semiconductor is formed under the low oxygen partial pressure, the reliability of the oxide semiconductor may not be lowered or reduced, and degradation in layer uniformity due to indium metal particles may be prevented or reduced in the manufacturing process of the thin film transistor.

BRIEF DESCRIPTION OF THE DRAWINGS

The above and other features of embodiments of the present disclosure will become readily apparent by reference to the following detailed description when considered in conjunction with the accompanying drawings wherein.

DETAILED DESCRIPTION

Figure 1:
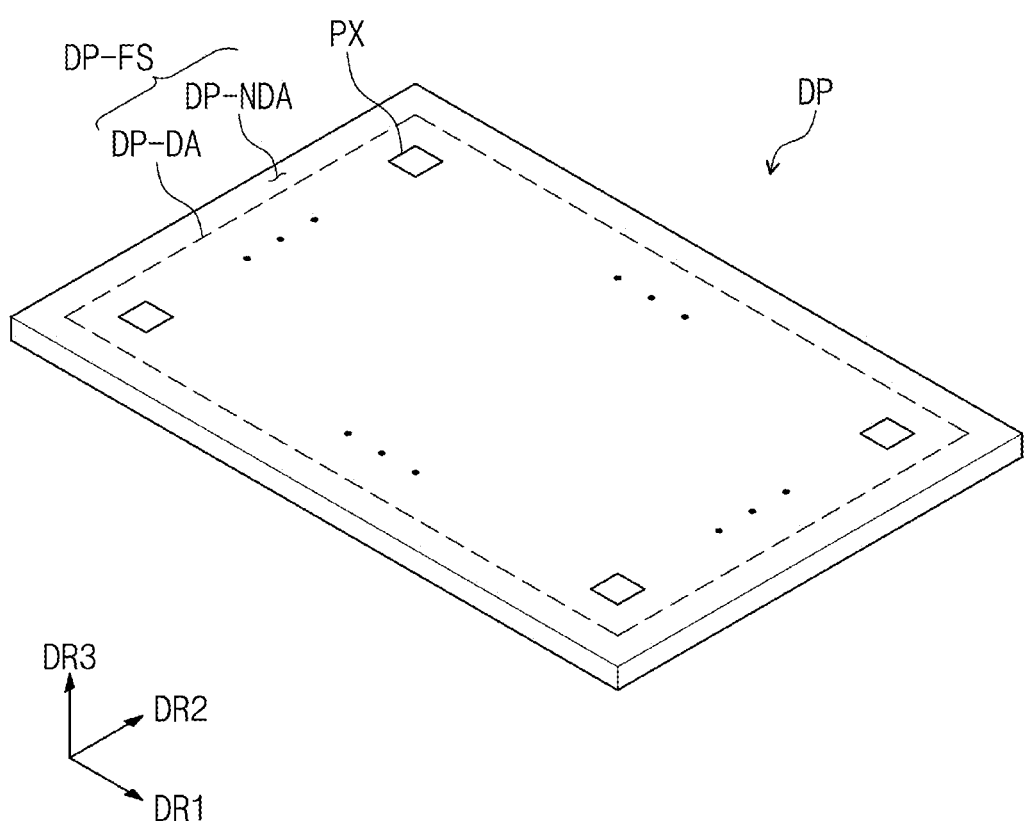
FIG. 1 is a perspective view showing a display panel according to an exemplary embodiment of the present disclosure.

Hereinafter, it will be understood that when an element or layer is referred to as being "on", "coupled to" or "coupled to" another element or layer, it can be directly on, coupled or coupled to the other element or layer or intervening elements or layers may be present. In contrast, when an element is referred to as being "directly on," "directly coupled to" or "directly coupled to" another element or layer, there are no intervening elements or layers present.

Like numerals refer to like elements throughout. In the drawings, the thickness, ratio, and dimension of components may be exaggerated for effective description of the technical content. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the spirit and scope of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, a thin film transistor and a display panel including the thin film transistor according to the present disclosure will be explained in more detail with reference to FIGS. 1-4.

Figure 2:
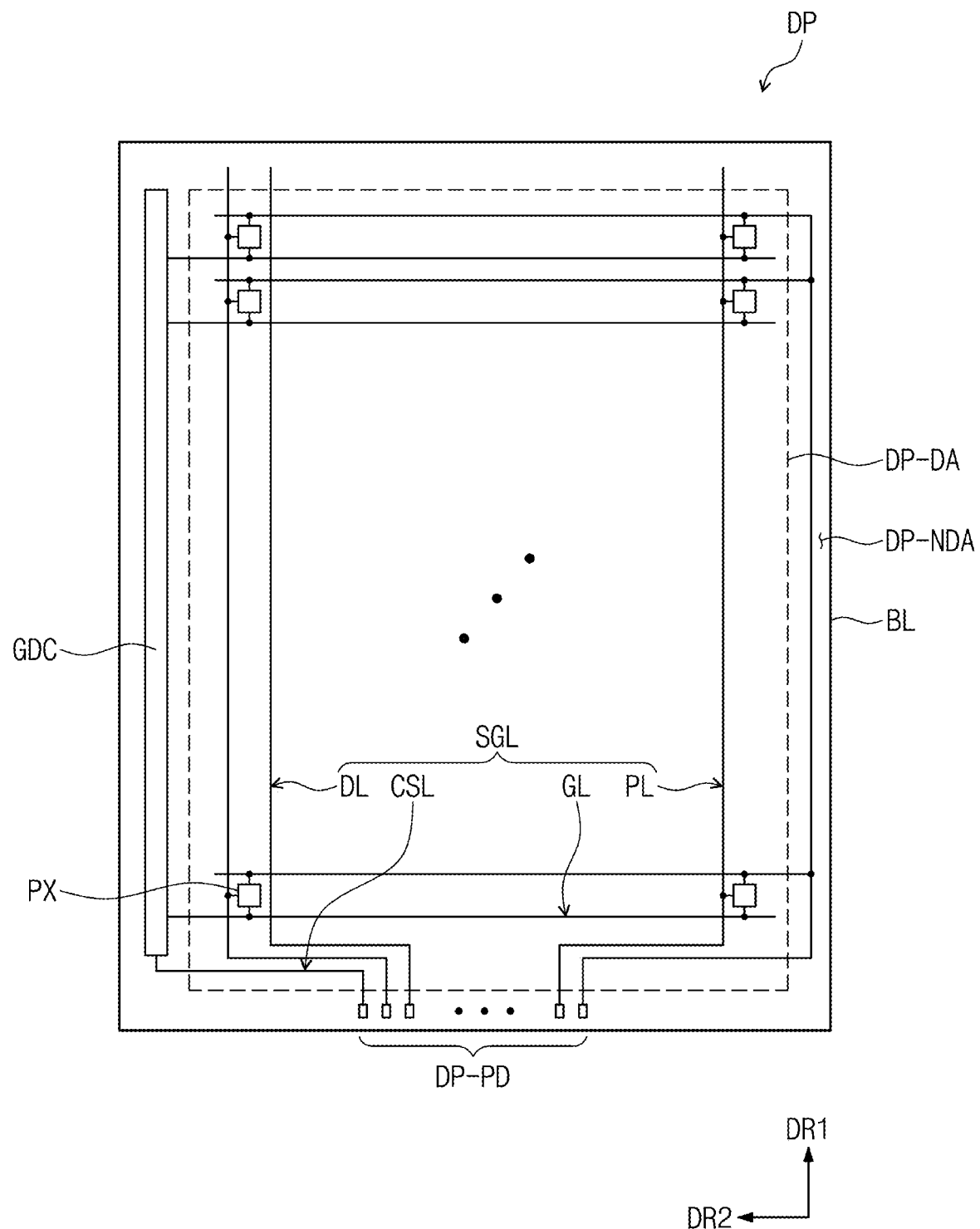
FIG. 2 is a plan view showing a display panel according to an exemplary embodiment of the present disclosure.

FIG. 1 is a perspective view showing a display panel DP according to an exemplary embodiment of the present disclosure. FIG. 2 is a plan view showing the display panel DP according to an exemplary embodiment of the present disclosure. FIG. 2 schematically shows a connection relation between pixels PX, a driving circuit GDC, and a plurality of signal lines SGL.

A front surface DP-FS of the display panel DP is substantially parallel to a plane defined by a first direction DR1 and a second direction DR2. A third direction DR3 indicates a normal line direction of the front surface DP-FS of the display panel DP, e.g., a thickness direction of the display panel DP. Upper (or front) and lower (or rear) surfaces of each layer of the display panel DP are distinguished from each other in the third direction DR3.

Referring to FIG. 1, the display panel DP includes a display area DP-DA in which the pixels PX are on the front surface DP-FS and a non-display area DP-NDA defined adjacent to the display area DP-DA. The pixels PX are not arranged in the non-display area DP-NDA. Some lines of the plurality of signal lines SGL and/or the driving circuit GDC are arranged in the non-display area DP-NDA.

As shown in FIG. 1, the display area DP-DA may have a quadrangular shape, but the present disclosure is not limited thereto. The non-display area DP-NDA may surround the display area DP-DA, however, it should not be limited thereto or thereby. The shape of the display area DP-DA and the shape of the non-display area DP-NDA may be relatively designed, and the display area DP-DA and the non-display area DP-NDA may each have any suitable shape generally used in the art. For instance, the non-display area DP-NDA may be only in areas facing each other in first direction DR1. The display area DP-DA may have a circular shape.

Referring to FIG. 2, the display panel DP includes the driving circuit GDC, the plurality of signal lines SGL, a plurality of signal pads DP-PD (hereinafter, referred to as "signal pads"), and the pixels PX.

The pixels PX may be classified into a plurality of groups depending on colors displayed by the pixels PX. The pixels PX may include, for example, red pixels, green pixels, and/or blue pixels. The pixels PX may further include white pixels. Although the pixels PX are classified into different groups from each other depending on colors displayed thereby, the pixel driving circuits of the pixels PX may be substantially the same as each other.

The driving circuit GDC includes a gate driving circuit. The gate driving circuit generates a plurality of gate signals (hereinafter, referred to as "gate signals") and sequentially outputs the gate signals to a plurality of gate lines GL (hereinafter, referred to as "gate lines") described in more detail herein below. The gate driving circuit may further output other control signals to the pixel driving circuit of the pixels PX.

The gate driving circuit may include a plurality of thin film transistors formed through the same (e.g., substantially the same) processes, e.g., a low temperature polycrystalline silicon (LTPS) process or a low temperature polycrystalline oxide (LTPO) process, as the pixel driving circuit of the pixels PX.

The plurality of signal lines SGL include the gate lines GL, data lines DL, a power line PL, and a control signal line CSL. Each of the gate lines GL is coupled to a corresponding pixel among the pixels PX, and each of the data lines DL is coupled to a corresponding pixel among the pixels PX. The power line PL is coupled to the pixels PX. The control signal line CSL provides the control signals to the gate driving circuit. Each of the signal pads DP-PD is coupled to a corresponding signal line among the plurality of signal lines SGL. In some embodiments, the plurality of signal lines SGL may further include light emitting signal lines.

In embodiments of the present disclosure, each of the pixels PX may be a light emitting type pixel. For instance, each of the pixels PX may include an organic light emitting diode or a quantum dot light emitting diode as a light emitting element. A light emitting layer of the organic light emitting diode may include an organic light emitting material. A light emitting layer of the quantum dot light emitting diode may include a quantum dot or a quantum rod. Hereinafter, the organic light emitting type pixel will be described as a representative example of the pixel PX, but the present disclosure is not limited thereto.

The pixel PX may include the organic light emitting diode and the pixel driving circuit to drive the organic light emitting diode. The organic light emitting diode may be a front surface light emitting type diode or a rear surface light emitting type diode. The pixel driving circuit may include at least a switching thin film transistor, a driving thin film transistor, and a capacitor. A high power supply voltage may be supplied to the driving thin film transistor, and a low power supply voltage may be supplied to one electrode of the organic light emitting diode. The driving thin film transistor may control a driving current flowing through the organic light emitting diode in response to an amount of electric charges charged in the capacitor (e.g., according to an amount of electric charge stored in the capacitor). The switching thin film transistor outputs a data signal applied thereto via the data line in response to a gate signal applied thereto via the gate line. The capacitor is charged with a voltage corresponding to the data signal from the switching thin film transistor.

The pixel driving circuit may include six or seven thin film transistors including the switching thin film transistor and the driving thin film transistor. The configuration of the pixel driving circuit should not be particularly limited. The plurality of signal lines SGL may be designed in view of the configuration of the pixel driving circuit.

Figure 3:
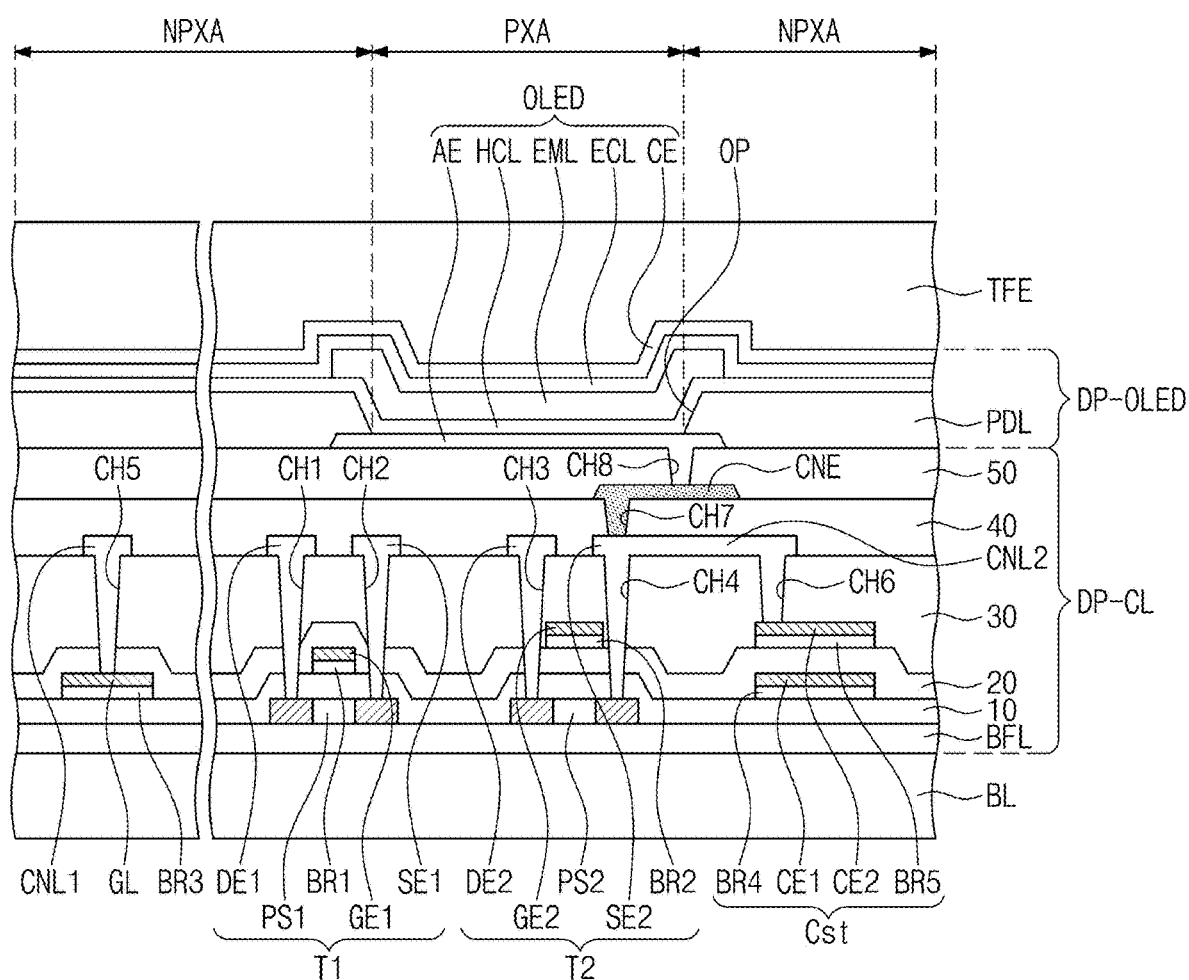
FIG. 3 is a cross-sectional view showing a portion of a pixel according to an exemplary embodiment of the present disclosure.
Figure 4:
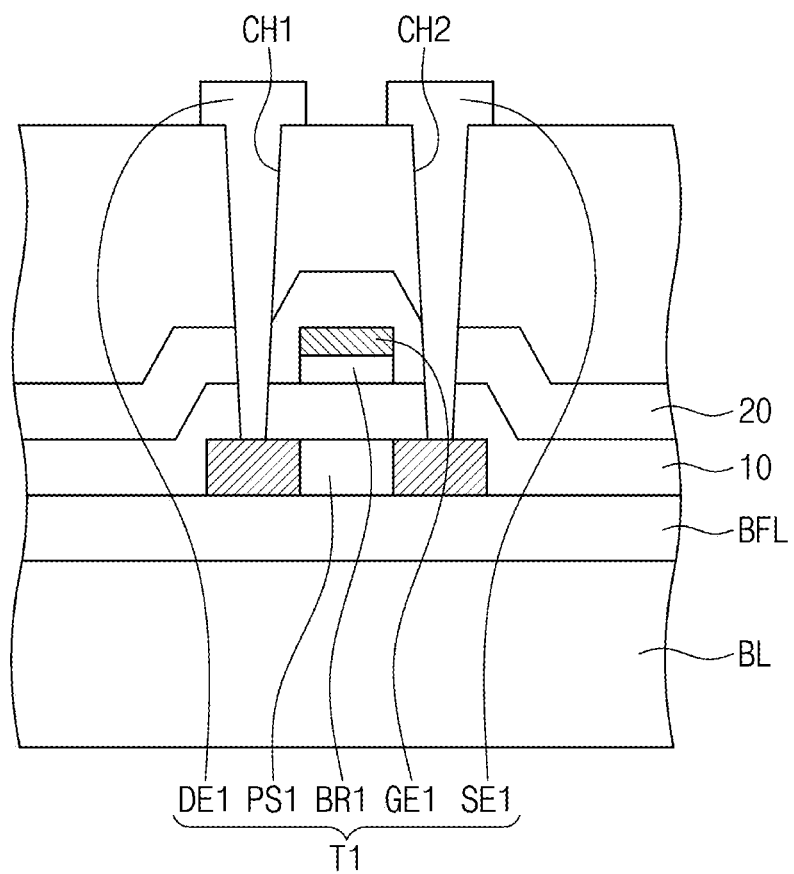
FIG. 4 is a cross-sectional view showing a transistor according to an exemplary embodiment of the present disclosure.

FIG. 3 is a cross-sectional view showing a portion of the pixel PX according to an exemplary embodiment of the present disclosure. FIG. 3 shows a cross-section corresponding to the switching thin film transistor T1 (hereinafter, referred to as a "first thin film transistor"), the driving thin film transistor T2 (hereinafter, referred to as a "second thin film transistor"), the capacitor Cst, and the organic light emitting diode OLED as portions of the pixel PX. In addition, FIG. 3 shows a cross-section corresponding to the gate line GL. FIG. 4 is a cross-sectional view showing a transistor according to an exemplary embodiment of the present disclosure. FIG. 4 shows a cross-section corresponding to the first thin film transistor T1 of FIG. 3.

Referring to FIG. 3, the display panel DP may include a base layer BL, a circuit element layer DP-CL on the base layer BL, a display element layer DP-OLED, and a thin film encapsulation layer TFE. In an exemplary embodiment of the present disclosure, the thin film encapsulation layer TFE may be replaced with an encapsulation substrate, e.g., a metal substrate and/or a glass substrate. The display panel DP may further include functional layers, such as an anti-reflective layer and a refractive index control layer. The circuit element layer DP-CL may include at least a plurality of insulating layers and a circuit element. Hereinafter, the insulating layers may include an organic layer and/or an inorganic layer.

The circuit element may include the signal line and the pixel driving circuit. The circuit element layer may be formed by forming an insulating layer, a semiconductor layer, and a conductive layer using coating and depositing processes and by patterning the insulating layer, the semiconductor layer, and the conductive layer using a photolithography process. The display element layer DP-OLED may include a light emitting element. The display element layer DP-OLED may include the same (e.g., substantially the same) organic layer as the pixel definition layer PDL.

The base layer BL may include a synthetic resin layer. A synthetic resin layer may include a heat-curable resin. For example, the synthetic resin layer may be a polyimide-based resin layer, however, it should not be limited thereto or thereby. The synthetic resin layer may include at least one selected from an acrylic-based resin, a methacrylic-based resin, polyisoprene, a vinyl-based resin, an epoxy-based resin, a urethane-based resin, a cellulose-based resin, a siloxane-based resin, a polyamide-based resin, and a perylene-based resin. In addition, the base layer BL may include a glass substrate, a metal substrate, or an organic/inorganic composite material substrate.

At least one inorganic layer may be formed on an upper surface of the base layer BL. The inorganic layer may include at least one selected from aluminum oxide, titanium oxide, silicon nitride, silicon oxide, silicon oxynitride, zirconium oxide, and hafnium oxide. The inorganic layer may have a multi-layer structure. The inorganic layer having the multi-layer structure may form a buffer layer BFL. Entry of a foreign substance from the outside of the display panel may be prevented or reduced by the buffer layer BFL. In addition, the buffer layer BFL may improve a bonding strength between the base layer BL and conductive patterns and/or semiconductor patterns, as compared with the case where conductive patterns and/or semiconductor patterns are directly formed on the base layer BL.

The first thin film transistor T1 and the second thin film transistor T2 are on the buffer layer BFL. The second thin film transistor T2 is electrically coupled to the first thin film transistor T1. The gate line GL and the capacitor Cst are further on the buffer layer BFL. The gate line GL is electrically coupled to the first thin film transistor T1, and the capacitor Cst is electrically coupled to the second thin film transistor T2.

A first semiconductor pattern PS1 and a second semiconductor pattern PS2 may be on the buffer layer BFL. Each of the first semiconductor pattern PS1 and the second semiconductor pattern PS2 may include an oxide semiconductor, however, it should not be limited thereto or thereby. The first semiconductor pattern PS1 and the second semiconductor pattern PS2 may include polycrystalline silicon semiconductor, amorphous silicon, and/or oxide semiconductor in the same ratio or in different ratios. The first semiconductor pattern PS1 and the second semiconductor pattern PS2 may include an oxide semiconductor containing gallium (Ga) oxide, zinc (Zn) oxide, and/or indium (In) oxide. The first semiconductor pattern PS1 and the second semiconductor pattern PS2 may include may include an oxide semiconductor containing indium gallium zinc oxide (IGZO) obtained by doping zinc oxide with indium and gallium.

Each of the first semiconductor pattern PS1 and the second semiconductor pattern PS2 may include a contact area and a channel area. In more detail, each of the first semiconductor pattern PS1 and the second semiconductor pattern PS2 may include an input area (or first portion), an output area (or second portion), and the channel area (or third portion) defined between the input area and the output area. The channel area of the first semiconductor pattern PS1 may be defined to correspond to a first barrier pattern BR1 and a first control electrode GE1, which are described in more detail herein below, and the channel area of the second semiconductor pattern PS2 may be defined to correspond to a second barrier pattern BR2 and a second control electrode GE2, which are described in more detail herein below. The input area and the output area may be doped with dopants, and thus, may have a relatively high conductivity as compared with the channel area. The input area and the output area may be doped with n-type dopants. In the present exemplary embodiment, an n-type first semiconductor pattern PS1 and an n-type second semiconductor pattern PS2 are described as a representative example, however, each of the first semiconductor pattern PS1 and the second semiconductor pattern PS2 may be a p-type transistor and may be doped with different dopants from each other.

A first insulating layer 10 is on the buffer layer BFL. The first insulating layer 10 commonly overlaps the pixels PX (refer to FIGS. 1 and 2) and covers the first semiconductor pattern PS1 and the second semiconductor pattern PS2. The first insulating layer 10 may be an inorganic layer and/or an organic layer and may have a single-layer or multi-layer structure.

The first barrier pattern BR1 and the first control electrode GE1 are on the first insulating layer 10. The first barrier pattern BR1 and the first control electrode GE1 overlap the channel area of the first semiconductor pattern PS1. The first insulating layer 10 is located to be in contact (e.g., direct contact) with the first semiconductor pattern PS1, the first barrier pattern BR1 is located to be in contact (e.g., direct contact) with the first insulating layer 10, and the first control electrode GE1 is located to be in contact (e.g., direct contact) with the first barrier pattern BR1.

The first barrier pattern BR1 may include gallium (Ga) oxide and zinc (Zn) oxide. The first barrier pattern BR1 may include a material in which the gallium oxide and the zinc oxide are mixed. The first barrier pattern BR1 may include gallium zinc oxide (GZO) obtained by doping zinc oxide with gallium. According to an embodiment, a content of gallium oxide is from about 4 at % to about 8 at % with respect to a total amount of atoms in the first barrier pattern BR1, and a content of zinc oxide is from about 92 at % to about 96 at % with respect to the total amount of atoms in the first barrier pattern BR1. The first barrier pattern BR1 may have a thickness from about 100 angstroms to about 200 angstroms. Because the first barrier pattern BR1 has the composition ratio and the thickness range described herein, a problem caused by a difference in etch rate between different materials may be prevented or reduced in a process of etching the first barrier pattern BR1 and the first control electrode GE1.

The first control electrode GE1 may have a two-layer stacked structure. The first control electrode GE1 may include a first layer including titanium (Ti) and a second layer on the first layer and including copper (Cu). The first layer of the first control electrode GE1 may be in contact with the first barrier pattern BR1, and the second layer may be spaced apart from the first barrier pattern BR1 with the first layer interposed therebetween.

In some embodiments, a third barrier pattern BR3 and a fourth barrier pattern BR4 may be on the first insulating layer 10. The gate line GL may be on the third barrier pattern BR3. A first electrode CE1 of the capacitor Cst may be on the fourth barrier pattern BR4.

The third barrier pattern BR3 and the fourth barrier pattern BR4 may be formed through substantially the same process as the first barrier pattern BR1. For example, the third barrier pattern BR3 and the fourth barrier pattern BR4 may include substantially the same material as the first barrier pattern BR1. The third barrier pattern BR3 and the fourth barrier pattern BR4 may include gallium (Ga) oxide and zinc (Zn) oxide.

The gate line GL and the first electrode CE1 may be formed through substantially the same process as the first control electrode GE1, and thus, the gate line GL and the first electrode CE1 may have substantially the same stack structure as the first control electrode GE1. In some embodiments, the first control electrode GE1 may be coupled to the gate line GL in a plan view. The gate line GL may apply a turn-on signal to the first thin film transistor T1.

A second insulating layer 20 is on the first insulating layer 10 to cover the first barrier pattern BR1, the first control electrode GE1, the third barrier pattern BR3, the gate line GL, the fourth barrier pattern BR4, and the first electrode CE1. The second insulating layer 20 commonly overlaps the pixels PX. The second insulating layer 20 may be an inorganic layer and/or an organic layer and may have a single-layer or multi-layer structure. According to an embodiment, the second insulating layer 20 may be an inorganic layer formed by a chemical vapor deposition (CVD) method.

The second barrier pattern BR2 and a fifth barrier pattern BR5 may be on the second insulating layer 20. The second control electrode GE2 may be on the second barrier pattern BR2. A second electrode CE2 of the capacitor Cst may be on the fifth barrier pattern BR5. The second barrier pattern BR2 and the second control electrode GE2 may overlap the channel area of the second semiconductor pattern PS2.

The second barrier pattern BR2 and the fifth barrier pattern BR5 may include substantially the same material as the first barrier pattern BR1. The second barrier pattern BR2 and the fifth barrier pattern BR5 may include gallium (Ga) oxide and zinc (Zn) oxide. The second control electrode GE2 and the second electrode CE2 may be formed through substantially the same process, and thus, may have substantially the same stack structure. The second control electrode GE2 and the second electrode CE2 may include substantially the same material as the first control electrode GE1 and may have substantially the same stack structure as the first control electrode GE1. In some embodiments, according to another embodiment, the second control electrode GE2 may be on substantially the same layer as the first control electrode GE1.

A third insulating layer 30 may be on the second insulating layer 20 to cover the second barrier pattern BR2, the second control electrode GE2, the fourth barrier pattern BR4, and the second electrode CE2. The third insulating layer 30 may be an inorganic layer and/or an organic layer and may have a single-layer or multi-layer structure. The first insulating layer 10, the second insulating layer 20, and the third insulating layer 30 may include at least one selected from aluminum oxide, titanium oxide, silicon nitride, silicon oxide, silicon oxynitride, zirconium oxide, and hafnium oxide. In the present exemplary embodiment, the third insulating layer 30 may have a single-layer structure of silicon oxide.

Connection signal lines and input/output electrodes may be on the third insulating layer 30. A first input electrode DE1 and a first output electrode SE1 may be on the third insulating layer 30 to be respectively coupled to an input area and an output area of the first semiconductor pattern PS1 through a first contact hole CH1 and a second contact hole CH2. A second input electrode DE2 and a second output electrode SE2 may be on the third insulating layer 30 to be respectively coupled to an input area and an output area of the second semiconductor pattern PS2 through a third contact hole CH3 and a fourth contact hole CH4. The first to fourth contact holes CH1 to CH4 may penetrate through the first insulating layer 10, the second insulating layer 20, and the third insulating layer 30.

A first connection signal line CNL1 and a second connection signal line CNL2 may be on the third insulating layer 30. The first connection signal line CNL1 may be coupled to the gate line GL through a fifth contact hole CH5, and the second connection signal line CNL2 may be coupled to the second electrode CE2 through a sixth contact hole CH6. In some embodiments, the first connection signal line CNL1 may be coupled to another thin film transistor of the pixel driving circuit.

A fourth insulating layer 40 may be on the third insulating layer 30 to cover the connection signal lines and the input/output electrodes. A material for the fourth insulating layer 40 should not be particularly limited. A connection electrode CNE may be on the fourth insulating layer 40. The connection electrode CNE may be directly or indirectly (e.g., electrically coupled through another connection signal line) coupled to the second output electrode SE2 through a seventh contact hole CH7 defined through the fourth insulating layer 40. A fifth insulating layer 50 (or passivation layer) may be on the fourth insulating layer 40 to cover the connection electrode CNE. The fifth insulating layer 50 may be an organic layer and may have a single-layer or multi-layer structure.

In the present exemplary embodiment, each of the fourth insulating layer 40 and the fifth insulating layer 50 may be a single-layer structure of polyimide-based resin layer, however, it should not be limited thereto or thereby. For example, each of the fourth insulating layer 40 and the fifth insulating layer 50 may include at least one selected from an acrylic-based resin, a methacrylic-based resin, a polyisoprene, a vinyl-based resin, an epoxy-based resin, a urethane-based resin, a cellulose-based resin, a siloxane-based resin, a polyimide-based resin, and a perylene-based resin.

The organic light emitting diode OLED is on the fifth insulating layer 50. An anode AE of the organic light emitting diode OLED is on the fifth insulating layer 50. The anode AE is coupled to the connection electrode CNE through an eighth contact hole CH8 defined through the fifth insulating layer 50. A pixel definition layer PDL is on the fifth insulation layer 50.

At least a portion of the anode AE may be exposed through an opening OP of the pixel definition layer PDL. The opening OP of the pixel definition layer PDL may define a light emitting area PXA of the pixel. For instance, the pixels PX (refer to FIG. 1) may be arranged on the display panel DP (refer to FIG. 1) in a plan view. Areas in which the pixels PX are arranged may be defined as pixel areas, and one pixel area may include the light emitting area PXA and a non-light emitting area NPXA defined adjacent to the light emitting area PXA. The non-light emitting area NPXA may surround the light emitting area PXA.

A hole control layer HCL may be commonly located in the light emitting area PXA and the non-light emitting area NPXA. A common layer such as the hole control layer HCL may be commonly formed in the pixels PX (refer to FIGS. 1 and 2). The hole control layer HCL may include a hole transport layer and a hole injection layer.

An organic light emitting layer EML may be on the hole control layer HCL. The organic light emitting layer EML may be only in an area corresponding to the opening OP. For example, the organic light emitting layers EML of the pixels PX may have a boundary therebetween.

In the present exemplary embodiment, the organic light emitting layer EML is patterned. The organic light emitting layer EML may be commonly located in the pixels PX. In this case, the organic light emitting layer EML may generate a white light or a blue light. In addition, the organic light emitting layer EML may have a multi-layer structure.

An electron control layer ECL may be on the organic light emitting layer EML. The electron control layer ECL may include an electron transport layer and an electron injection layer. A cathode CE may be on the electron control layer ECL. The electron control layer ECL and the cathode CE may be commonly located in the pixels PX.

The thin film encapsulation layer TFE is on the cathode CE. The thin film encapsulation layer TFE is commonly located in the pixels PX. In the present exemplary embodiment, the thin film encapsulation layer TFE directly covers the cathode CE. In an exemplary embodiment of the present disclosure, a capping layer may be included to cover the cathode CE. In an exemplary embodiment of the present disclosure, a stacked structure of the organic light emitting diode OLED may have a structure that is upside down (e.g., flipped 180°) from the structure shown in FIG. 3.

The thin film encapsulation layer TFE may include at least an inorganic layer and an organic layer. In an exemplary embodiment of the present disclosure, the thin film encapsulation layer TFE may include two inorganic layers and an organic layer between the two inorganic layers. In an exemplary embodiment of the present disclosure, the thin film encapsulation layer TFE may include a plurality of inorganic layers and a plurality of organic layers alternately stacked with the inorganic layers.

The encapsulation inorganic layer may protect the organic light emitting diode OLED from moisture and oxygen, and the encapsulation organic layer may protect the organic light emitting diode OLED from a foreign substance, e.g., dust particles. The encapsulation inorganic layer may include a silicon nitride layer, a silicon oxynitride layer, a silicon oxide layer, a titanium oxide layer, and/or an aluminum oxide layer, however, it should not be particularly limited. The encapsulation organic layer may include an acrylic-based organic layer, however, it should not be particularly limited.

Different from FIG. 3, the fourth insulating layer 40 and the connection electrode CNE may be omitted according to an exemplary embodiment of the present disclosure. The fifth insulating layer 50 may cover the second output electrode SE2, and the anode AE may be directly or indirectly coupled to the second output electrode SE2. According to the present exemplary embodiment, the second thin film transistor T2 and the organic light emitting diode OLED are electrically coupled directly in view of an equivalent circuit, however, the present disclosure should not be limited thereto or thereby. In an exemplary embodiment of the present disclosure, another thin film transistor may be further between the second thin film transistor T2 and the organic light emitting diode OLED in view of the equivalent circuit.

The first thin film transistor included in the display panel according to the exemplary embodiment of the present disclosure includes the first barrier pattern under the first control electrode, and the first barrier pattern includes a metal oxide. For example, the first barrier pattern includes gallium oxide and zinc oxide. Because the thin film transistor according to the exemplary embodiment include the barrier pattern containing the gallium zinc oxide, even though the oxide semiconductor pattern is formed under a low oxygen partial pressure process, stability and reliability of the oxide semiconductor pattern may be improved by supplying oxygen in a process in which the barrier pattern formed of gallium zinc oxide is formed on the oxide semiconductor pattern. Accordingly, the conductivity of the oxide semiconductor pattern increases by the low oxygen partial pressure process while maintaining high stability and reliability of the oxide semiconductor pattern.

Hereinafter, a manufacturing method of the display panel according to an exemplary embodiment of the present disclosure will be described with reference to FIGS. 5A-5K.

FIGS. 5A-5K are cross-sectional views showing the manufacturing method of the display panel according to an exemplary embodiment of the present disclosure. FIGS. 5A-5E and 5H-5K show an area corresponding to FIG. 3. In FIGS. 5A to 5K, duplicative descriptions of the same elements as those described with reference to FIGS. 1-4 will not be repeated here.

Figure 5A:
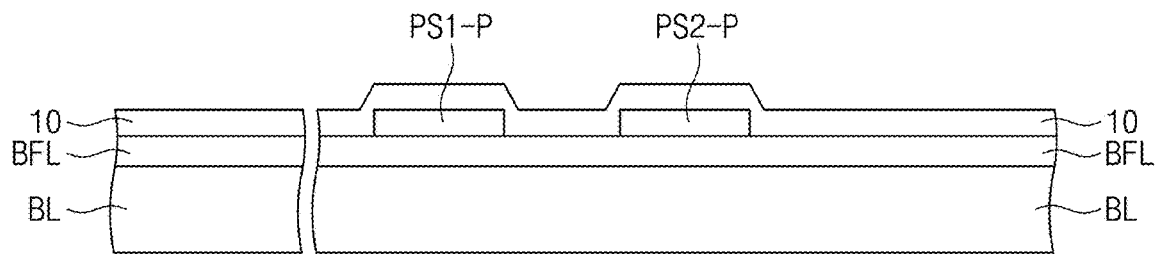
FIGS. 5A-5K are cross-sectional views showing a manufacturing process of a display panel according to an exemplary embodiment of the present disclosure.

Referring to FIG. 5A, an inorganic layer is formed on the base layer BL. The inorganic layer is formed by depositing an inorganic material, and a plurality of inorganic layers may be formed by sequentially depositing a plurality of inorganic materials in the manufacturing method of the display panel. For instance, the buffer layer BFL may be formed by sequentially forming the silicon oxide layer and the silicon nitride layer in the manufacturing method of the display panel.

As shown in FIG. 5A, a first preliminary semiconductor pattern PS1-P and a second preliminary semiconductor pattern PS2-P are formed on the buffer layer BFL. The first preliminary semiconductor pattern PS1-P and the second preliminary semiconductor pattern PS2-P are formed by forming and patterning a semiconductor layer. The semiconductor layer is crystallized both before and after patterning. The first preliminary semiconductor pattern PS1-P and the second preliminary semiconductor pattern PS2-P are formed of gallium (Ga) oxide, zinc (Zn) oxide, and/or indium (In) oxide. In the forming of the first preliminary semiconductor pattern PS1-P and the second preliminary semiconductor pattern PS2-P, an oxygen partial pressure may be equal to or smaller than about 40%. As the first preliminary semiconductor pattern PS1-P and the second preliminary semiconductor pattern PS2-P are formed under the condition of the oxygen partial pressure that is equal to or smaller than about 40%, electrical characteristics such as conductivity (e.g., electrical conductivity) of the semiconductor pattern may be improved.

As shown in FIG. 5A, the first insulating layer 10 is formed on the buffer layer BFL. The first insulating layer 10 is formed by a depositing, coating, or printing process. The method of forming the first insulating layer 10 may be suitably or appropriately selected depending on the material of the first insulating layer 10. For example, the first insulating layer 10 may be formed by depositing silicon oxide and/or silicon nitride using the chemical vapor deposition (CVD) method.

Figure 5B:
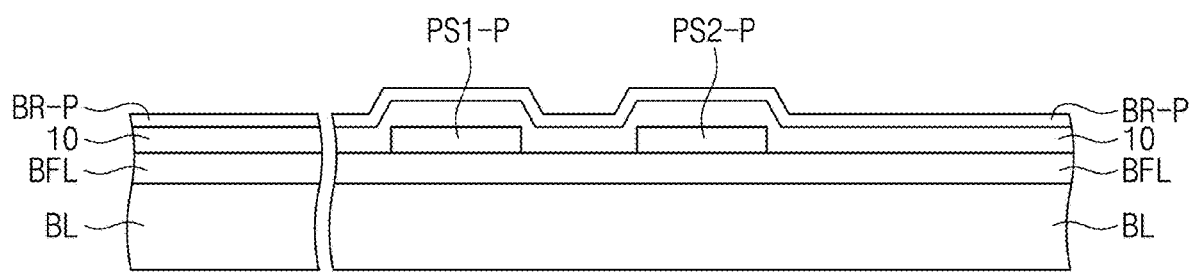

Referring to FIG. 5B, a first preliminary barrier layer BR-P may be formed on the first insulating layer 10 using the metal oxide. The first preliminary barrier layer BR-P may be formed of gallium (Ga) oxide and zinc (Zn) oxide. In the forming of the first preliminary barrier layer BR-P, zinc doped with gallium may be deposited under the condition of the oxygen partial pressure equal to or greater than about 60% such that the first preliminary barrier layer BR-P is formed of gallium zinc oxide (GZO). In the first preliminary barrier layer BR-P, the content of gallium oxide may be from about 4 at % to about 8 at %, and the content of zinc oxide may be from about 92 at % to about 96 at %.

Figure 5C:
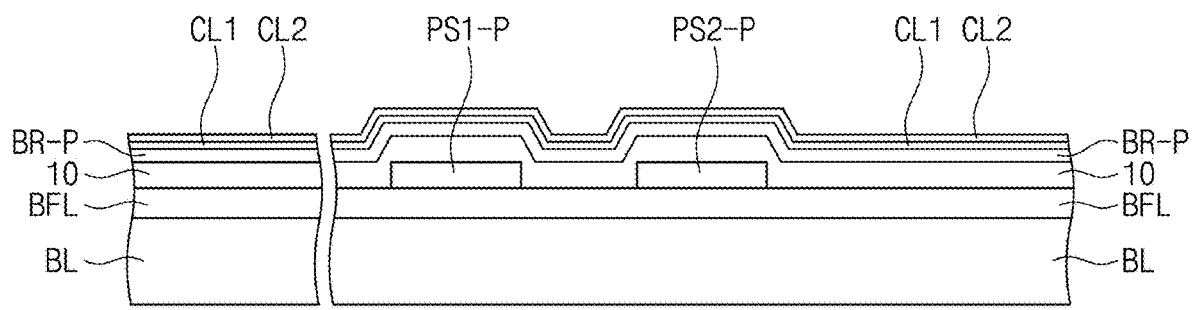

Referring to FIG. 5C, a first layer CL1 and a second layer CL2 may be successively formed on the first preliminary barrier layer BR-P. The first layer CL1 and the second layer CL2 may be formed by depositing different metal materials from each other. The first layer CL1 may be formed by depositing titanium (Ti). The second layer CL2 may be formed by depositing copper (Cu). Hereinafter, the first layer CL1 and the second layer CL2 may be referred to as preliminary electrode layers that form electrodes and wires by an etching process.

Figure 5D:
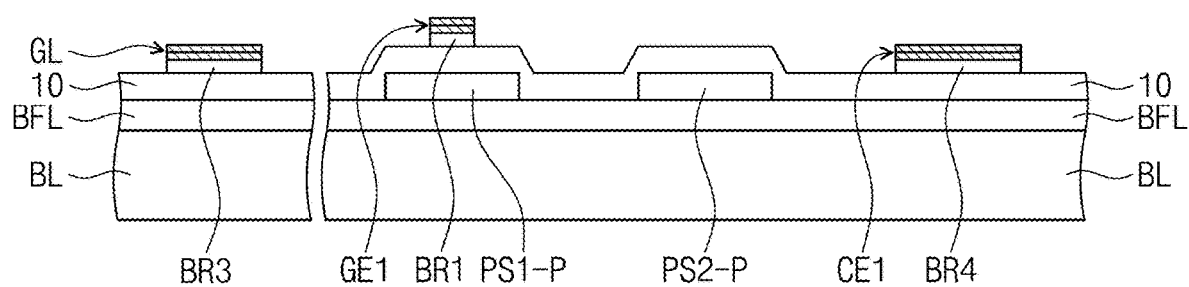

Referring to FIG. 5D, the first preliminary barrier layer BR-P, the first layer CL1, and the second layer CL2 are patterned. As the first preliminary barrier layer BR-P is patterned, the first barrier pattern BR1, the third barrier pattern BR3, and the fourth barrier pattern BR4 are formed. As the first and second layers CL1 and CL2 are patterned, the first control electrode GE1, the gate line GL, and the first electrode CE1 are formed. The first preliminary barrier layer BR-P, the first layer CL1, and the second layer CL2 may be patterned by any suitable wet etching method or dry etching method used in the art. The first preliminary barrier layer BR-P, the first layer CL1, and the second layer CL2 may be patterned through the same (e.g., substantially the same) etching process at one time.

In the manufacturing method of the display panel, the barrier pattern is formed of gallium zinc oxide after forming the semiconductor pattern and before forming the control electrode. Accordingly, although the oxide semiconductor pattern is formed under the condition of the low oxygen partial pressure, the stability and reliability of the oxide semiconductor pattern may be improved by supplying the oxygen in the process in which the barrier pattern formed of gallium zinc oxide is formed on the oxide semiconductor pattern.

Figure 5E:
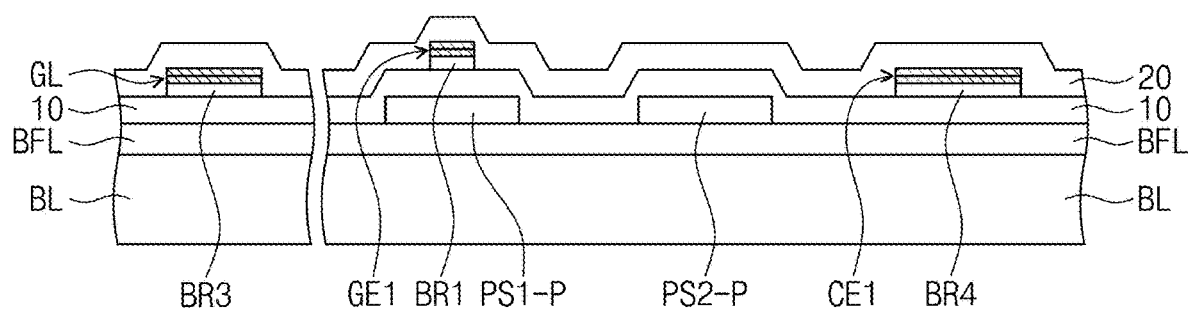

Referring to FIG. 5E, the second insulating layer 20 is formed on the first insulating layer 10. The second insulating layer 20 may be formed by depositing the inorganic material or the organic material using the chemical vapor deposition (CVD) method. According to an embodiment, the second insulating layer 20 may be formed by depositing silicon oxide or silicon nitride using the chemical vapor deposition (CVD) method.

Figure 5F:
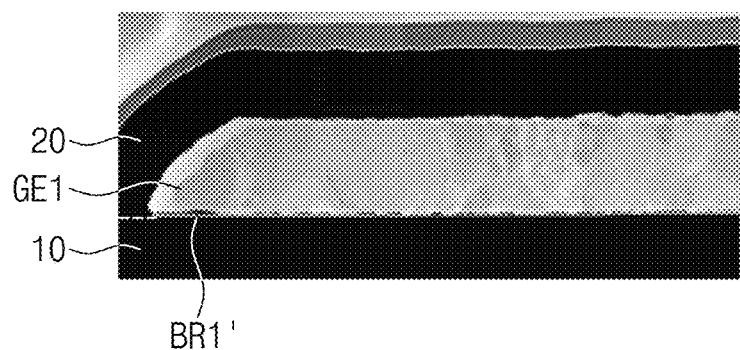
Figure 5G:
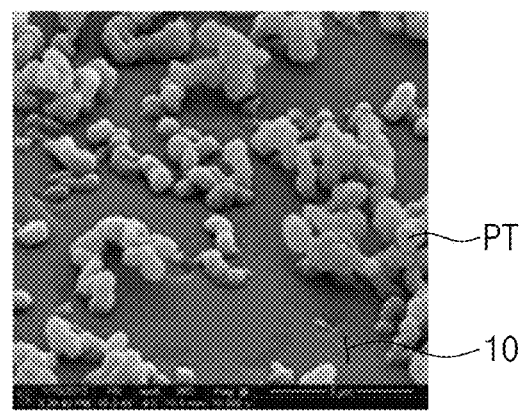

FIGS. 5F and 5G are enlarged views showing states of the first insulating layer, the barrier pattern, the control electrode, and the second insulating layer when a barrier pattern BR1' is formed of a material different from that of the exemplary embodiment of the present disclosure. FIGS. 5F and 5G show the states when the barrier pattern BR1' is formed of a material containing indium.

As shown in FIGS. 5F and 5G, when the barrier pattern BR1' is formed of the material containing indium (for example, indium gallium zinc oxide (IGZO)), indium oxide contained in the barrier pattern BR1' may be reduced to indium metal at a high temperature condition in the subsequent process. For example, when a temperature equal to or greater than about 200° C. is applied in the process of forming the second insulating layer 20 on the barrier pattern BR1' and the first control electrode GE1 by the chemical vapor deposition method, the indium oxide may be reduced to the indium metal by hydrogen gas. The reduced indium metal may be diffused to the first control electrode GE1 or may generate voids due to metal particles PT at an interface between the first control electrode GE1 and the first insulating layer 10. As a result, a uniformity of the insulating layer may be degraded or reduced, and increased haze may result.

In the exemplary embodiment of the present disclosure, the barrier pattern is formed a material that does not include indium, e.g., gallium zinc oxide (GZO), and thus, the reduced metal particles are not generated even though heat is generated in the subsequent process. Therefore, defects, such as degradation in layer uniformity of the insulating layer and occurrence of haze, may be prevented or reduced.

Figure 5H:
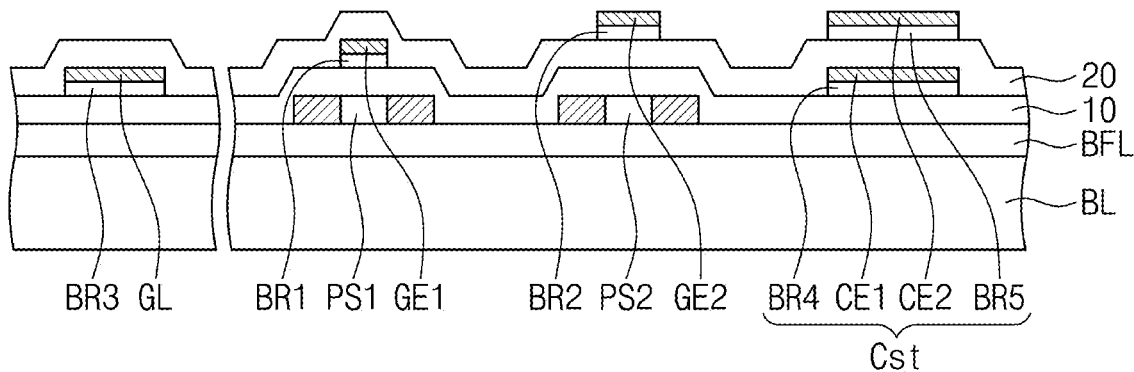

Referring to FIG. 5H, the second barrier pattern BR2 and the fifth barrier pattern BR5 are formed on the second insulating layer 20, the second control electrode GE2 is formed on the second barrier pattern BR2, and the second electrode CE2 is formed on the fifth barrier pattern BR5. The second control electrode GE2 and the second electrode CE2 may have a single-layer or multi-layer structure. The second barrier pattern BR2, the second control electrode GE2, the fifth barrier pattern BR5, and the second electrode CE2 may be formed through the processes shown in FIGS. 5B-5D.

The first preliminary semiconductor pattern PS1-P and the second preliminary semiconductor pattern PS2-P may be doped using the first control electrode GE1 and the second control electrode GE2 as a mask. Areas (hereinafter, referred to as "channel areas") that respectively overlap the first control electrode GE1 and the second control electrode GE2 are not doped, and both areas (the input area and the output area) of each channel area are doped. In the present exemplary embodiment, both areas may be doped with the n-type dopants, e.g., 5-valent elements (e.g., pentavalent elements).

After that, a heat treatment process may be carried out. The first semiconductor pattern PS1 and the second semiconductor pattern PS2 are heat-treated at a temperature from about 400° C. to about 500° C., for example, about 450° C. The dopants may be uniformly (e.g., substantially uniformly) diffused into the input area and the output area by the heat treatment process.

Figure 5I:
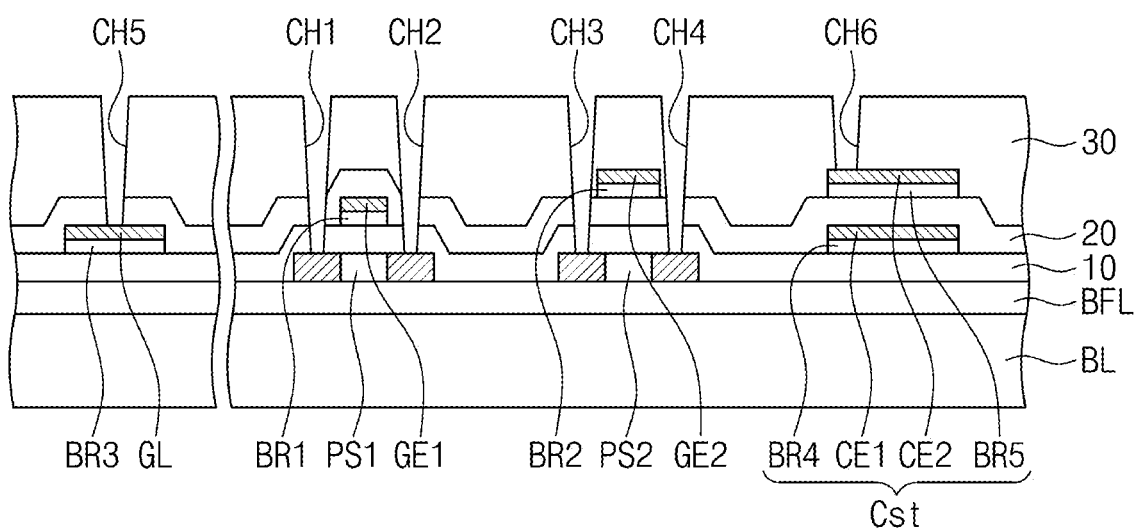

Referring to FIG. 5I, the third insulating layer 30 may be formed on the second insulating layer 20. The third insulating layer 30 may be formed by a depositing, coating, and/or printing process. Then, the first to sixth contact holes CH1 to CH6 may be formed. In this case, some portions of the first and second semiconductor patterns PS1 and PS2, which are exposed through the first to fourth contact holes CH1 to CH4, may be oxidized. A cleaning process may be performed to lower a contact resistance of the first semiconductor pattern PS1 and the second semiconductor pattern PS2. A cleaning solution may remove silicon dioxide and the like formed around the first to fourth contact holes CH1 to CH4.

Figure 5J:
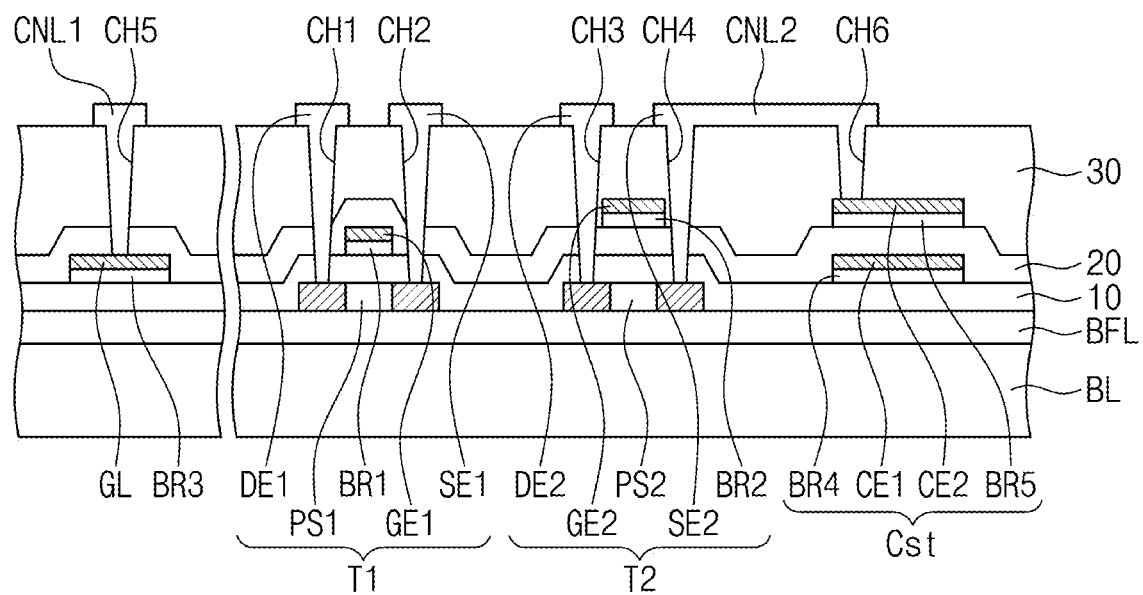

Referring to FIG. 5J, conductive patterns are formed on the third insulating layer 30 through a deposition process. The first input electrode DE1, the first output electrode SE1, the second input electrode DE2, the second output electrode SE2, the first connection signal line CNL1, and the second connection signal line CNL2 may be formed. The conductive patterns may have a three-layer structure of Ti/Al/Ti.

Figure 5K:
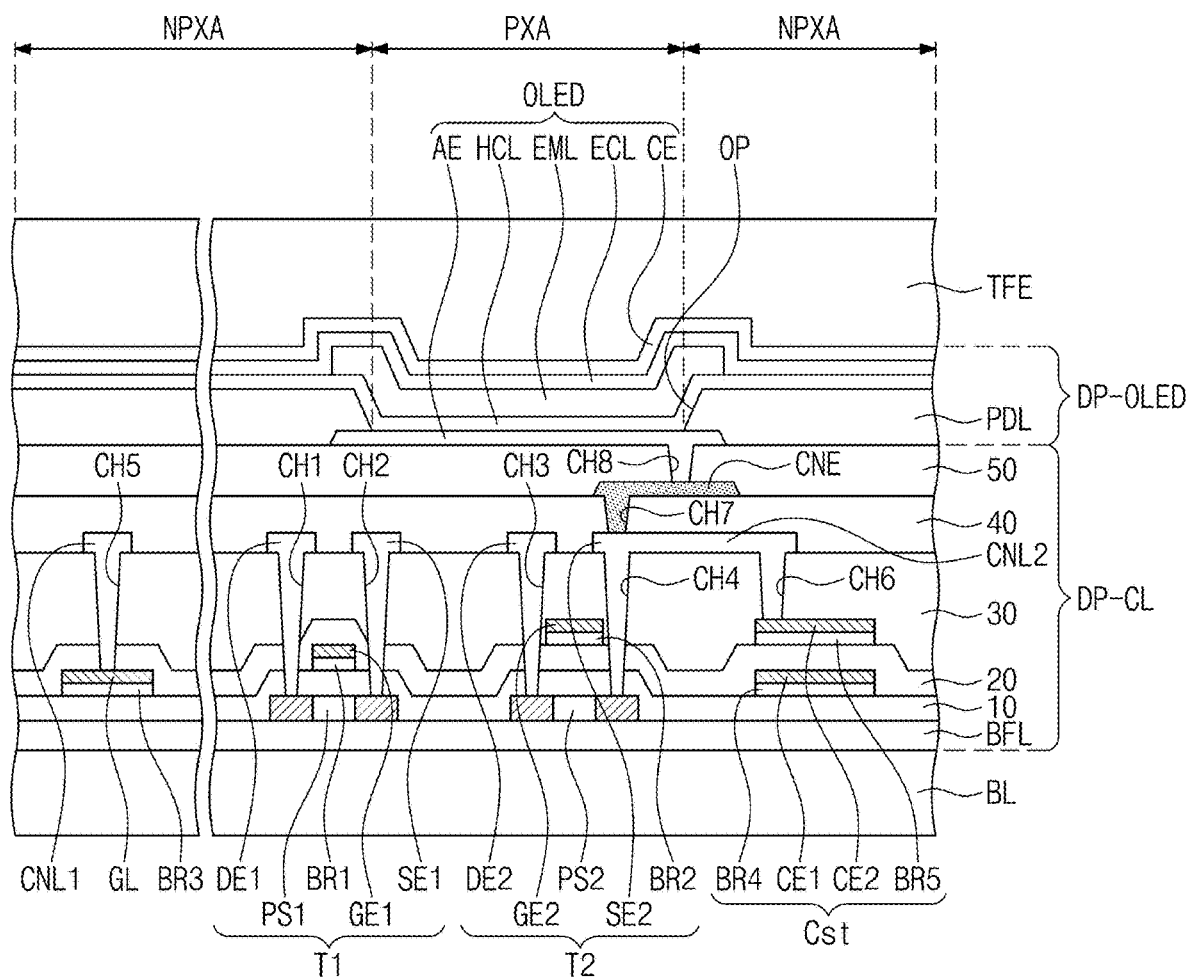

Referring to FIG. 5K, subsequent processes are performed to complete the display panel. The fourth insulating layer 40 is formed, and the seventh contact hole CH7 is formed. The connection electrode CNE is formed on the fourth insulating layer 40. The fifth insulating layer 50 is formed, and the eighth contact hole CH8 is formed. The organic light emitting diode OLED is formed on the fifth insulating layer 50.

The anode AE is formed on the fifth insulating layer 50 to be coupled to the connection electrode CNE through the eighth contact hole CH8. The pixel definition layer PDL is formed on the fifth insulating layer 50 to expose a center portion of the anode AE.

Then, the hole control layer HCL, the light emitting layer EML, the electron control layer ECL, and the cathode CE are sequentially formed. The thin film encapsulation layer TFE is formed on the cathode CE. The encapsulation organic layer and/or the encapsulation inorganic layer are formed by a deposition process and/or an inkjet printing process.

Figure 6A:
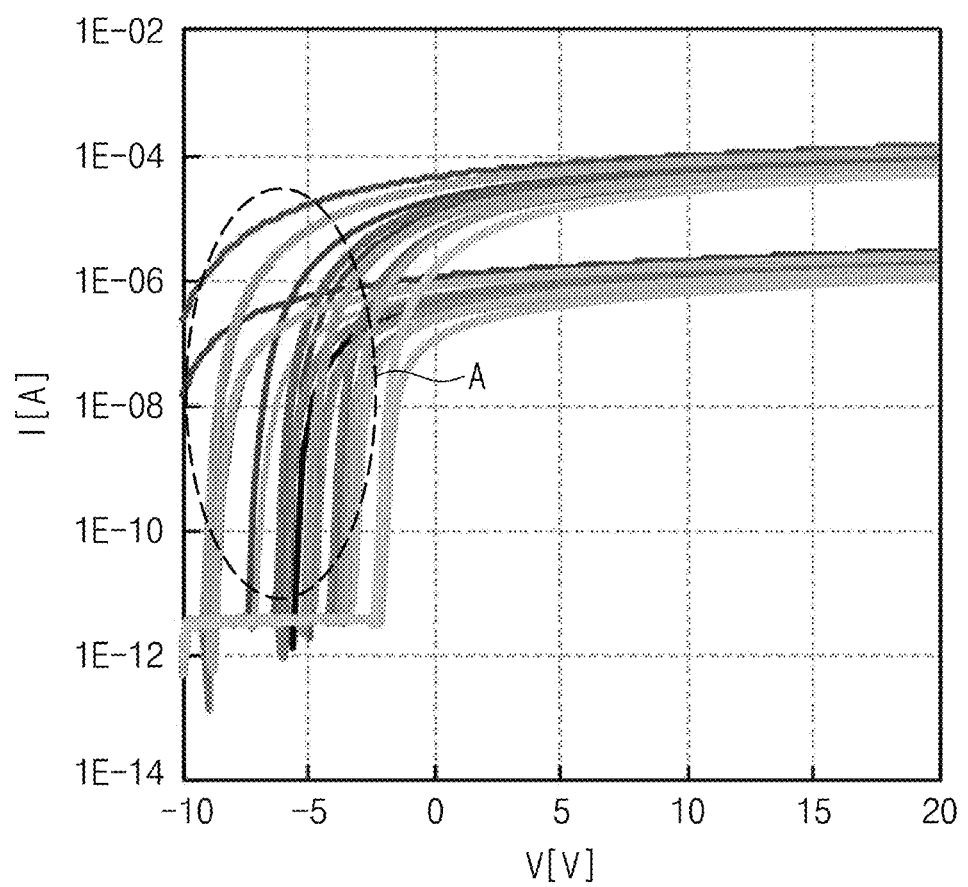
FIG. 6A is a graph showing electrical characteristics of an existing transistor.
Figure 6B:
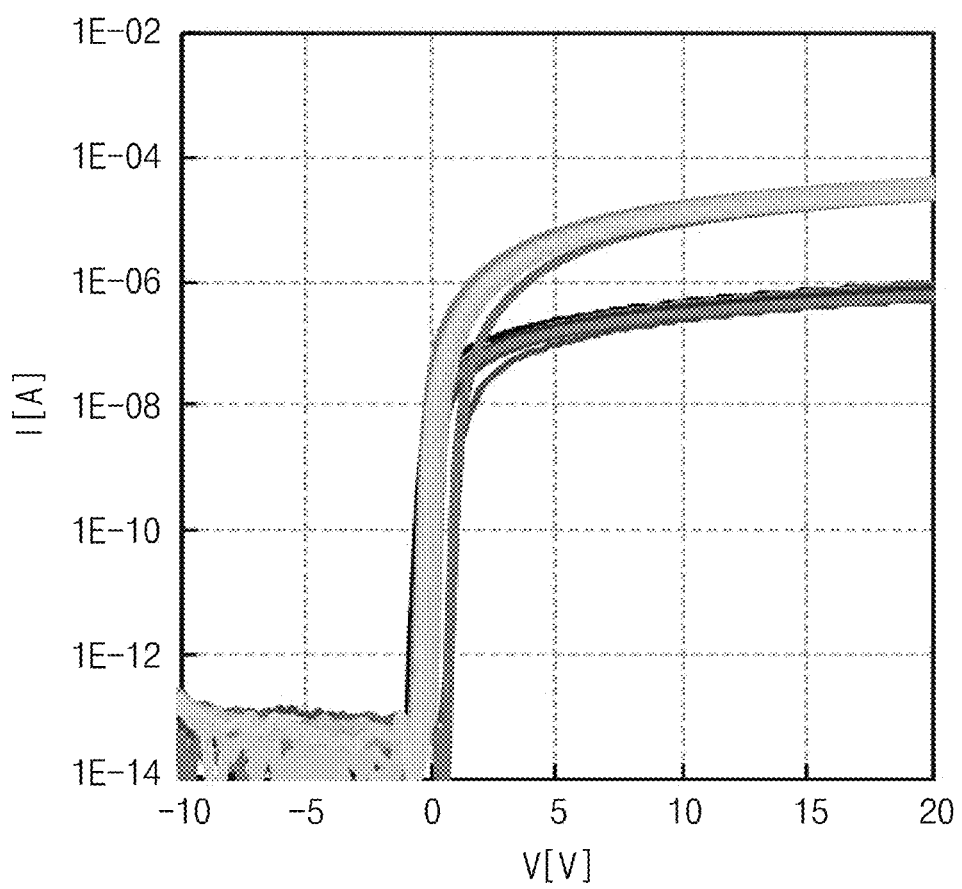
FIG. 6B is a graph showing electrical characteristics of a transistor according to an exemplary embodiment of the present disclosure.

FIG. 6A is a graph showing electrical characteristics of an existing transistor. FIG. 6B is a graph showing electrical characteristics of a transistor according to an exemplary embodiment of the present disclosure. FIG. 6B shows the electrical characteristics of the transistor in which the barrier pattern is located to overlap the semiconductor pattern and the control electrode is on the barrier pattern. FIG. 6A shows the electrical characteristics of the existing transistor from which the barrier pattern is omitted.

Referring to FIGS. 6A and 6B, because the transistor according to the exemplary embodiment of the present disclosure include the barrier pattern that overlaps the semiconductor pattern, the stability and the reliability of the semiconductor pattern may be improved, and the electrical characteristics of the transistor may be stably maintained. In the results of the region A of FIG. 6A, in the case of the existing transistor in which the barrier pattern is omitted, a short occurs in the oxide semiconductor pattern formed at the low oxygen partial pressure, and thus, the current density is not measured below a certain voltage. In the transistor according to the exemplary embodiment of the present disclosure, the oxygen may be provided to the oxide semiconductor pattern in the process of forming the barrier pattern that overlaps the semiconductor pattern. Thus, the stability and the reliability of the semiconductor pattern may be improved, and the short may be prevented from occurring (or a likelihood or degree of such a short may be reduced), thereby stably maintaining the electrical characteristics of the transistor.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present disclosure shall be determined according to the attached claims, and equivalents thereof.

What is claimed is:

1. A display panel comprising:
    a base layer;
    a first thin film transistor on the base layer;
    a second thin film transistor electrically coupled to the first thin film transistor; and
    a light emitting element electrically coupled to the second thin film transistor, the first thin film transistor comprising:
        a first semiconductor pattern on the base layer;
        a first insulating layer on the base layer to cover the first semiconductor pattern;
        a first barrier pattern directly on the first insulating layer and comprising a gallium (Ga) oxide and a zinc (Zn) oxide, wherein the first barrier pattern does not include indium (In); and
        a first control electrode directly on the first barrier pattern and overlapping the first semiconductor pattern,
    wherein a content of the gallium oxide is from about 4 at % to about 8 at % with respect to a total amount of atoms in the first barrier pattern, and a content of the zinc oxide is from about 92 at % to about 96 at % with respect to the total amount of atoms in the first barrier pattern.

2. The display panel of claim 1, wherein the first thin film transistor comprises a first input electrode and a first output electrode, which are coupled to the first semiconductor pattern.

3. The display panel of claim 1, wherein the first insulating layer is in contact with the first semiconductor pattern.

4. The display panel of claim 1, further comprising a second insulating layer on the first insulating layer to cover the first control electrode, wherein the second thin film transistor comprises:
    a second semiconductor pattern on the base layer;
    a second barrier pattern on the second insulating layer and comprising the gallium (Ga) oxide and the zinc (Zn) oxide;
    a second control electrode on the second barrier pattern and overlapping the second semiconductor pattern; and
    a second input electrode and a second output electrode, which are coupled to the second semiconductor pattern.

5. The display panel of claim 4, further comprising:
    a third barrier pattern on the first insulating layer; and
    a gate line on the third barrier pattern and electrically coupled to the first thin film transistor.

6. The display panel of claim 5, further comprising a capacitor electrically coupled to the second thin film transistor, wherein the capacitor comprises:
    a fourth barrier pattern on the first insulating layer;
    a first electrode on the fourth barrier pattern;
    a fifth barrier pattern on the second insulating layer; and
    a second electrode on the fifth barrier pattern.

7. The display panel of claim 6, wherein the third barrier pattern, the fourth barrier pattern, and the fifth barrier pattern comprise a same material as the first barrier pattern.

8. The display panel of claim 1, wherein the first control electrode comprises:
    a first layer comprising titanium (Ti); and
    a second layer on the first layer and comprising copper (Cu).

9. The display panel of claim 1, wherein the first semiconductor pattern comprises a gallium (Ga) oxide, a zinc (Zn) oxide, and an indium (In) oxide.

10. The display panel of claim 1, wherein the first barrier pattern has a thickness equal to or greater than about 100 angstroms and equal to or smaller than about 200 angstroms.

11. The display panel of claim 1, wherein the first insulating layer extends from the first thin film transistor to the second thin film transistor.

* * * * *